(12) United States Patent
Park

(10) Patent No.: US 7,160,789 B2
(45) Date of Patent: Jan. 9, 2007

(54) SHALLOW TRENCH ISOLATION AND METHOD OF FORMING THE SAME

(75) Inventor: Jong-Chul Park, Gyeonggi-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 263 days.

(21) Appl. No.: 10/969,348

(22) Filed: Oct. 19, 2004

(65) Prior Publication Data
US 2005/0087832 A1 Apr. 28, 2005

(30) Foreign Application Priority Data
Oct. 22, 2003 (KR) ............... 10-2003-0073836

(51) Int. Cl.
H01L 21/76 (2006.01)
(52) U.S. Cl. ............. 438/426; 438/437; 257/E21.549
(58) Field of Classification Search ............ 438/426, 438/435, 437; 257/E21.549
See application file for complete search history.

(56) References Cited

U.S. PATENT DOCUMENTS

| 6,521,538 B1 * | 2/2003 | Soga et al. ............ 438/695 |
| 6,828,212 B1 * | 12/2004 | Barry et al. ........... 438/424 |
| 2003/0017710 A1 * | 1/2003 | Yang et al. ........... 438/718 |
| 2003/0020110 A1 | 1/2003 | Tews et al. |

FOREIGN PATENT DOCUMENTS

| KR | 1997-0018141 | 4/1997 |
| KR | 010019290 | 3/2001 |

OTHER PUBLICATIONS

English language abstract of Korean Publication No. 1997-0018141.
English language abstract of Korean Publication No. 010019290.

* cited by examiner

*Primary Examiner*—Chandra Chaudhari
(74) *Attorney, Agent, or Firm*—Marger Johnson & McCollom, P. C.

(57) ABSTRACT

A shallow trench isolation (STI) structure and a method of forming the STI structure. The STI structure defines an active region formed with a recess channel transistor. The STI structure includes a STI trench has a laterally curved rounding portion on the bottom of the recess channel trench. In order to form the STI trench with the rounding portion, a semiconductor substrate is selectively and anisotropically dry etched to form the trench. Then, the semiconductor substrate is isotropically etched around the bottom height of the recess channel trench to form the rounding portion, and then further anisotropically dry etched, thereby forming the STI trench. After an insulating layer that fill the STI trench is formed on the resultant structure, an upper surface of the resultant structure is planarized to expose a surface of the semiconductor substrate.

17 Claims, 9 Drawing Sheets

SHALLOW TRENCH ISOLATION AND METHOD OF FORMING THE SAME

BACKGROUND OF THE INVENTION

This application claims the priority of Korean Patent Application No. 2003-73836, filed on Oct. 22, 2003, in the Korean Intellectual Property Office, the disclosure of which is incorporated herein by reference in its entirety.

1. Field of the Invention

The present invention relates to semiconductor integrated circuits and to a method of forming the same, and more particularly to a shallow trench isolation (STI) structure for recess channel transistors and a method of making the same.

2. Description of the Related Art

Increased packing density makes isolation techniques that electrically isolate mutually adjacent devices very important. Shallow trench isolation (STI) is a device isolation technique. In STI, a trench that defines an active region is formed in a semiconductor substrate. Then, the inside of the trench (i.e. the STI trench) is filled with an insulating material to form an isolating layer. Generally, the STI trench has a positively sloped sidewall in order to facilitate filling the trench with insulating material. Since the sidewalls of the STI trench are sloped, the width at the upper portion of the STI trench is larger than the width at a lower portion thereof. A method of forming an isolation region is disclosed in Korean Patent Laid-open No. 10-2001-0019290.

Increased packing density in semiconductor devices such as a DRAMs can result in forming a transistor with a short channel in an active region. This can result in punchthrough in a planar type transistor. Punchthrough can cause malfunctions of a highly integrated device. A recess channel transistor (RCT) can be used to achieve increased channel length. In the RCT, the channel is located along an outer periphery of a recess channel trench formed in the active region. As a result, there can be a relatively long channel.

However, if a recess channel transistor is fabricated in an active region defined by a conventional STI structure, silicon fences, (i.e., residual substrate areas) are formed on both bottom sides of the recess channel transistor. The residual substrate areas can significantly decrease the length of the channel, thereby deteriorating characteristics of the transistor. The residual substrate areas formed on both bottom sides of the recess channel transistor decrease the threshold voltage, which in turn increases leakage current.

FIG. 1a is a layout of a recess channel transistor. Referring to FIG. 1a, an active region 10 is defined by a field region 140 of the STI. A gate line pattern 20 is formed across the active region 10 and the field region 140.

FIGS. 1b, 1c and 1d are sectional views respectively taken along lines A–A', B–B' and C–C' of FIG. 1a, showing a semiconductor device including a conventional STI structure and a recess channel transistor.

Referring to FIG. 1b, a recess channel trench 160 is formed within an active region defined by a STI structure 140. A recess gate 190 fills inside the recess channel trench 160, and source and drain regions 150 are formed in both sides of the recess gate 190. Thus, the recess gate 190 and the source and drain regions 150 form the recess channel transistor altogether. A channel of the recess channel transistor is formed along the outer periphery of the trench as indicated by an arrow. Accordingly, a channel length of the recess channel transistor formed in the silicon substrate 100 is longer than that of a planar-type transistor.

However, when the recess channel transistor is formed in the active region defined by the STI as shown in FIG. 1d, silicon fences, or residual substrate areas, 11 are formed on both bottom sides of the recess channel trench 160. That is, as indicated by a dot-lined circle, the silicon substrate 100 is partially left between the sidewalls of the STI structure 140 and of the recess gate 190, thereby forming the residual substrate areas 11.

If the residual substrate areas 11 are formed, channel lengths at peripheries of the active region are shortened (refer to an arrow of FIG. 1c). In other words, the channel length at the periphery of the active region (refer to FIG. 1c) becomes shorter than the channel length at the center of the active region. Since the channel length is decreased as mentioned above, a threshold voltage of the transistor is decreased, which results in increased leakage current.

FIGS. 2a and 2b are sectional views showing a method of forming a recess channel trench in an active region defined by conventional STI. FIGS. 2a and 2b are cross-sectional views, taken along line C–C' of FIG. 1a.

Referring to FIG. 2a, the STI structure 140 with a positively sloped sidewall is formed in a semiconductor substrate 100. The sidewall of the STI structure is positively sloped because the STI trench is formed to insure a gap fill margin. Then, a mask layer pattern that defines a recess trench is formed on the resultant structure. At this time, a mask layer is patterned such that the mask layer is linearly opened along a gate line (refer to a reference numeral 20 of FIG. 1a). Therefore, FIGS. 2a and 2b which are sectional views, taken along line C–C', and they do not show a patterned mask layer.

As shown in FIG. 2b, anisotropic dry etching is performed to form a recess channel trench 160 using the mask layer pattern as an etch mask. Since the etch selectivity of the silicon substrate 100 relative to the STI structure 140 is large, the silicon substrate 100 in the active region is deeply etched to a depth H2 while etching the STI structure 140 by a prescribed depth H1.

The etching is carried out using the STI structure with a positive slope as a boundary. Therefore, as shown in FIG. 2b, the residual substrate areas 11 are formed on corners of a bottom surface of the recess channel trench 160. These areas greatly decreases the length of the channel at the periphery of the active region and they deteriorate characteristics of the transistor.

SUMMARY OF THE INVENTION

The present invention provides a device with a recess channel transistor with shallow trench isolation (STI) which does not have residual substrate areas on both bottom corners of the recess channel trench. The result is a more uniform channel length which improves the characteristics of the transistor.

In one embodiment, the present invention also provides a method of forming a STI structure which prevents formation of residual substrate areas on both bottom corners of the recess channel trench during fabricating a recess channel transistor. This method achieves a transistor with a uniform channel length, thus improving the characteristics of the transistor.

According to an aspect of the present invention, there is provided a shallow trench isolation (STI) structure that defines an active region formed with a recess channel transistor thereon. The STI structure includes a STI liner formed along an inner wall of a STI trench that defines the active region of a semiconductor device, and an insulating layer formed on the STI liner so as to fill the STI trench. Also, a sidewall of the STI has a generally positive slope and a rounding portion that is laterally curved around a bottom height of the recess channel trench formed on the active region of the semiconductor device.

According to another aspect of the present invention, a method of forming a STI for defining an active region formed with a recess channel transistor thereon includes (a) forming a mask layer pattern that defines the active region on a semiconductor substrate. Then, in a step (b), the semiconductor substrate is anisotropically dry etched to form a trench in the semiconductor substrate using the mask layer pattern as an etch mask. After forming a laterally curved rounding portion by isotropically etching the semiconductor substrate around a bottom height of the recess channel trench using the mask layer pattern as an etch mask in a step (c), the semiconductor substrate is anisotropically dry etched to form a STI trench using the mask layer pattern as an etch mask in a step (d). Thereafter, the method includes (e) forming an insulating layer that completely fills the STI trench on a resultant structure formed with the STI trench therein. Then, in a step (f), a resultant structure formed with the insulating layer thereon is planarized for exposing a surface of the semiconductor substrate, and forming a STI that defines the active region. Anisotropic dry etching in the step (b) is preferably performed while a passivation layer is formed by oxidation.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE PREFERRED EMBODIMENTS

Figure 1A:
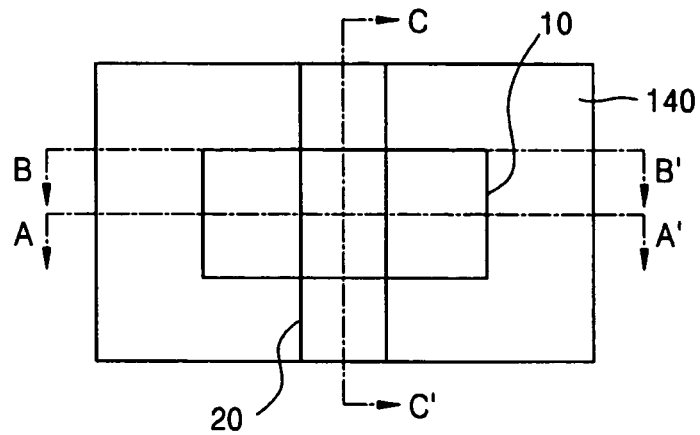
FIG. 1a shows a layout of a recess channel transistor.
Figure 1B:
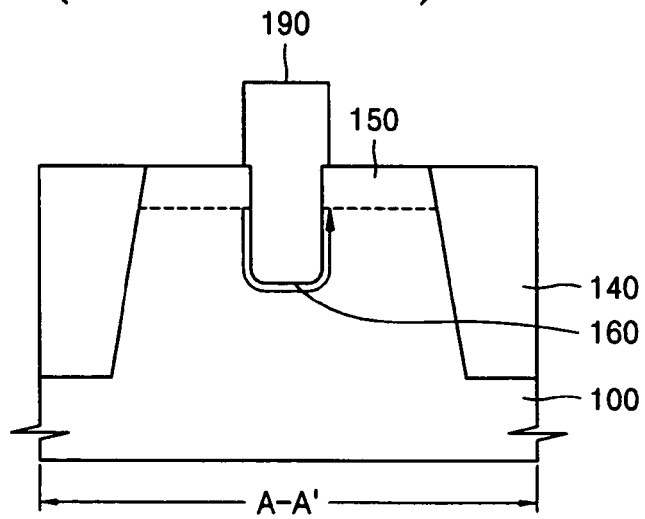
FIGS. 1b, 1c and 1d are cross-sectional views, respectively taken along lines A–A', B–B' and C–C' of FIG. 1a, showing a prior art semiconductor device including a conventional STI structure and the recess channel transistor.
Figure 1C:
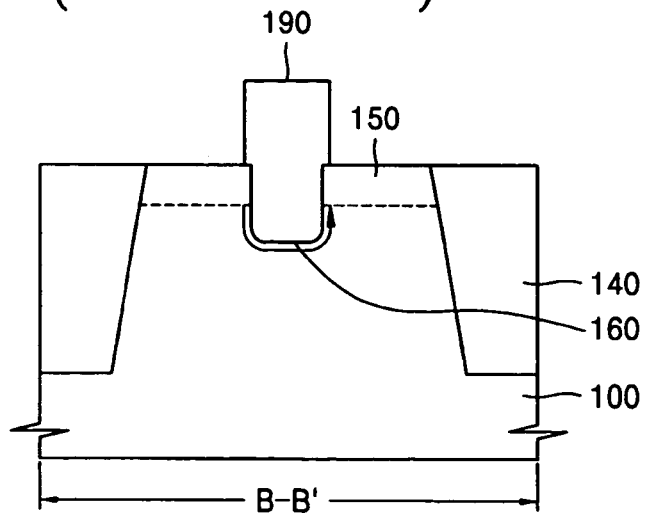

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will fully convey the concept of the invention to those skilled in the art. In the figures and description herein, the same reference characters refer to the same elements. In the drawings, thickness of layers and regions are exaggerated for clarity.

Figure 3:
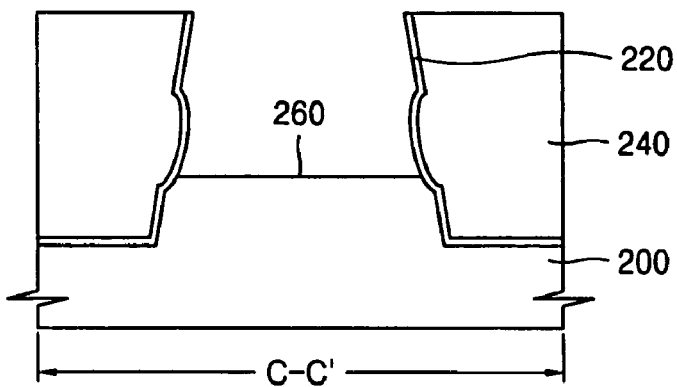
FIG. 3 is a sectional view showing a STI structure and a recess channel trench formed in an active region defined by the STI structure according to one embodiment of the present invention.

FIG. 3 is a cross-sectional view showing a STI structure and a recess channel trench formed in an active region defined by the STI structure according to one embodiment of the present invention. FIG. 3 is a cross-sectional view of a layout similar to that shown in FIG. 1a, taken along line C–C'.

Referring to FIG. 3, a STI liner 220 and an insulating layer 240 encircled by the STI liner 220 are formed in a semiconductor substrate 200. The STI structure defines an active region in the semiconductor substrate 200. The semiconductor substrate 200 is formed with a recess channel trench 260 bordering on a sidewall of the STI structure (or the STI liner 220). The recess channel trench 260 is formed for fabricating a recess channel transistor. That is, a recess gate (not shown) will be formed on the recess channel trench 260, thereby fabricating the recess channel transistor.

Figure 1D:
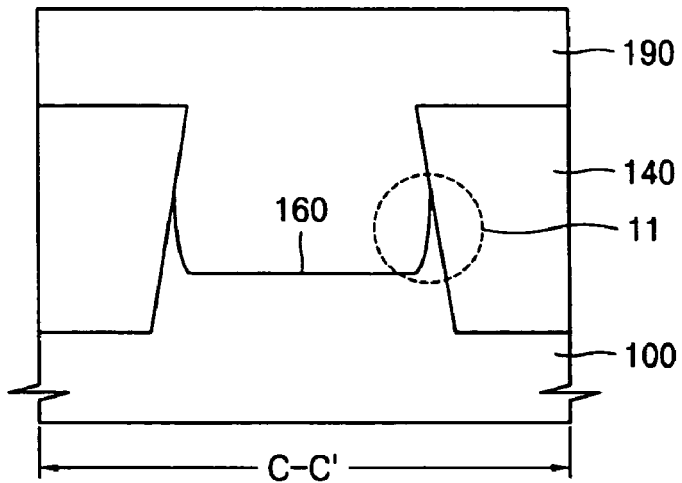
Figure 2A:
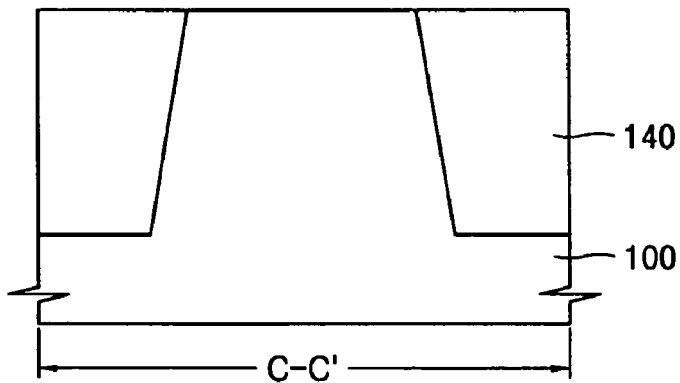
FIGS. 2a and 2b are sectional views showing a prior method of forming the recess channel trench in an active region defined by the conventional STI structure.
Figure 2B:
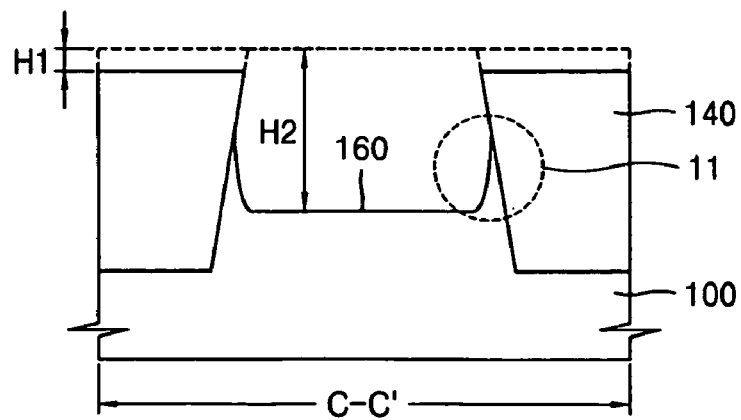

As shown in FIG. 3, the sidewall of the STI structure generally has a positive slope; however, there is a rounding portion laterally curved around a bottom height (i.e., a portion of the sidewall adjoining the bottom thereof). This differs from the conventional structure (refer to FIG. 1d or 2b) in that there may be no residual substrate area formed on the bottom corner of the recess channel trench 260. Accordingly, there is no significant decrease in the channel length caused by the residual substrate areas on both bottom corners of the recess channel trench 260.

A method of forming the STI structure according to one embodiment of the present invention will now be described. FIGS. 4 through 11 are cross-sectional views showing the method of forming the STI structure according to one embodiment of the present invention. These views are taken along line C–C' of a layout similar to that shown in FIG. 1a.

Figure 4:
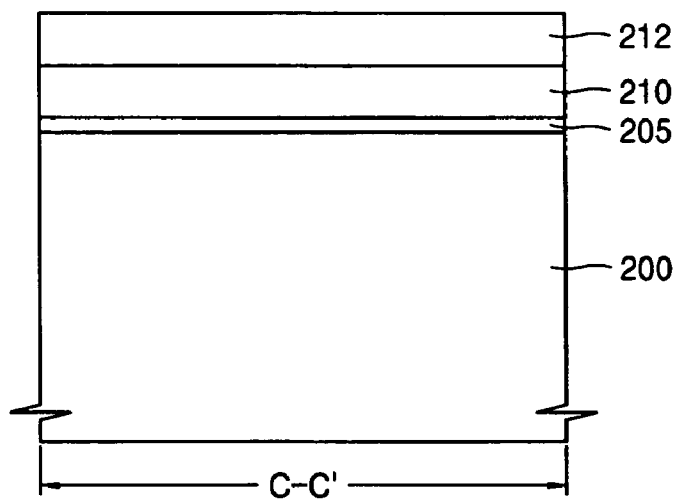
FIGS. 4 through 11 are cross-sectional views showing a method of forming the STI structure according to one embodiment of the present invention.

Referring to FIG. 4, after sequentially forming a pad oxide layer 205 and a nitride layer 210 on the semiconductor substrate 200, a photoresist layer 212 for patterning is formed on the nitride layer 210.

Figure 5:
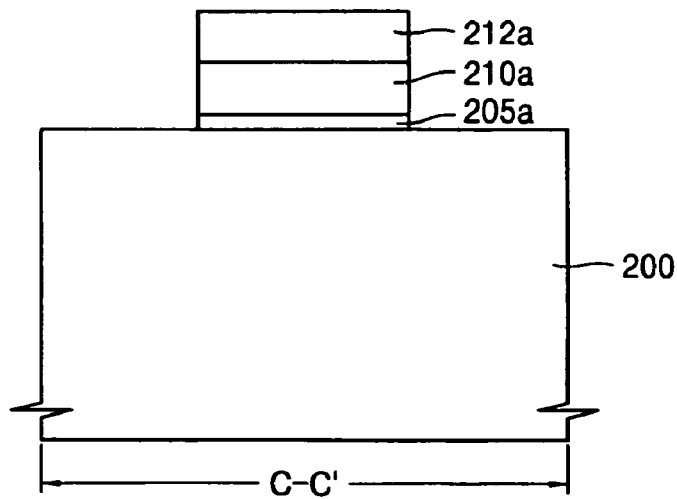

Referring to FIG. 5, a photoresist pattern 212a that defines the STI trench is formed by photolithography. Then, using the photoresist pattern 212a as a mask, the nitride layer 210 and the pad oxide layer 205 are patterned via dry etching, so that a nitride layer pattern 210a and a pad oxide layer pattern 205a are formed.

Figure 6:
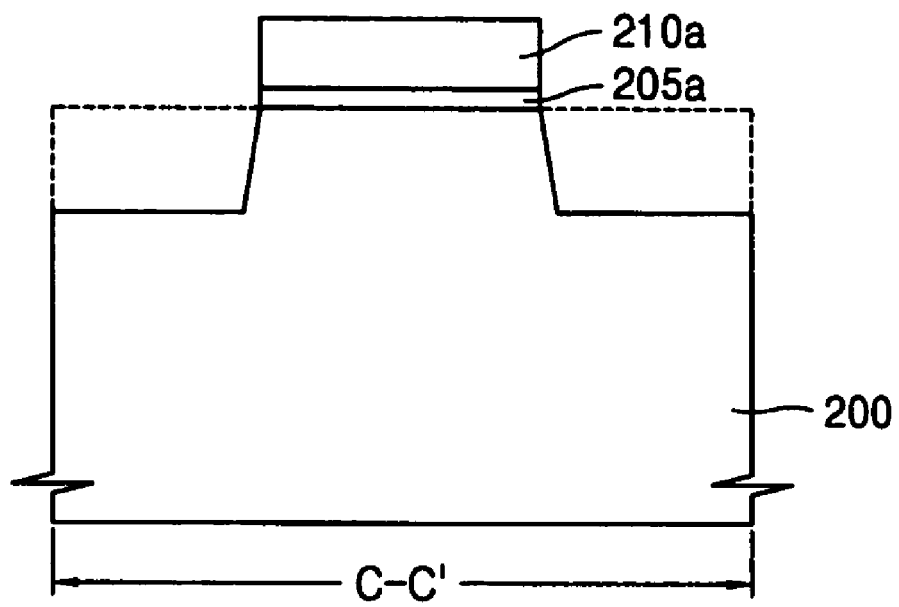

Referring to FIG. 6, after removing the photoresist pattern 212a, anisotropic etching is performed using the nitride layer pattern 210a and the pad oxide layer pattern 205a as etch masks, thereby forming a trench that corresponds to an upper portion of a STI trench to be formed later. At this time, the sidewall of the trench has a positive slope that allows for properly filling an insulating layer to be performed later. That is, the sidewall of the trench is sloped to make an upper width wider than a lower width thereof. A preferable slope of the sidewall is positively about 75° to 85°.

Anisotropic dry etching that forms the trench as shown in FIG. 6 is preferably Reactive Ion Etching (RIE) using a mixture of HBr and $O_2$. Here, RIE is performed by 95 sccm and 5 ccm amount of HBr and $O_2$ with an RF electrical power of 150 to 300 Watt under a pressure of 25 mTorr. The mixture used during the RIE may further include $Cl_2$.

Under the foregoing anisotropic dry etching, a passivation layer, i.e., a protecting layer, is formed by oxidation simultaneously with the etching, so that the passivation layer protects the sidewall of the trench from wet or dry etching that will be performed later (refer to FIGS. 7 and 8). The initially performed anisotropic dry etching is performed until a bottom surface of the trench reaches around a bottom height of a recess channel trench (designated by a reference numeral 260 of FIG. 14*a*), which will be formed in the semiconductor substrate 200 later.

Figure 7:
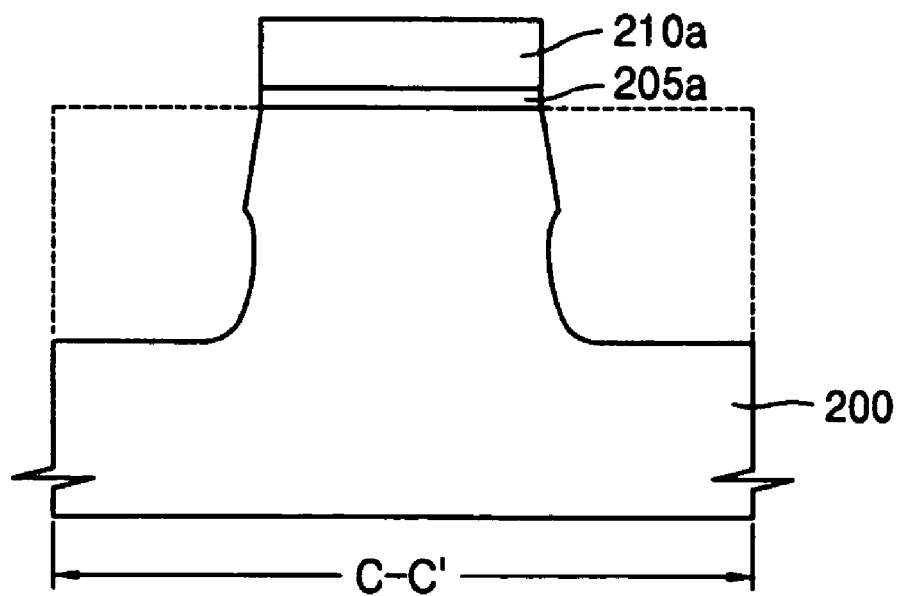

Referring to FIG. 7, isotropic etching is performed using the pad oxide layer pattern 205*a* and the nitride layer pattern 210*a* as etch masks. The isotropic etching is performed around the bottom height of the recess channel trench that will be formed in the semiconductor substrate 200 later. The isotropic etching may include wet etching using a chemical solution or dry etching.

Isotropic dry etching is preferably RIE using a gas of mixing $SF_6$, HBr and $O_2$. Here, an amount of $SF_6$, HBr and $O_2$ should be about 45 sccm, 75 sccm and 8 sccm, respectively, and RIE is performed with a RF electric power of about 100 to 500 Watt under a pressure of about 7 mTorr. The mixture used during RIE may further include $NF_3$.

The sidewall of the trench is formed with a laterally curved rounding portion via isotropic etching as shown in FIG. 7. That is, the sidewall of the trench is rounded via isotropic etching. The rounding portion acts for blocking formation of residual substrate areas on both bottom corners of the recess channel trench when the recess channel trench is formed later.

Figure 8:
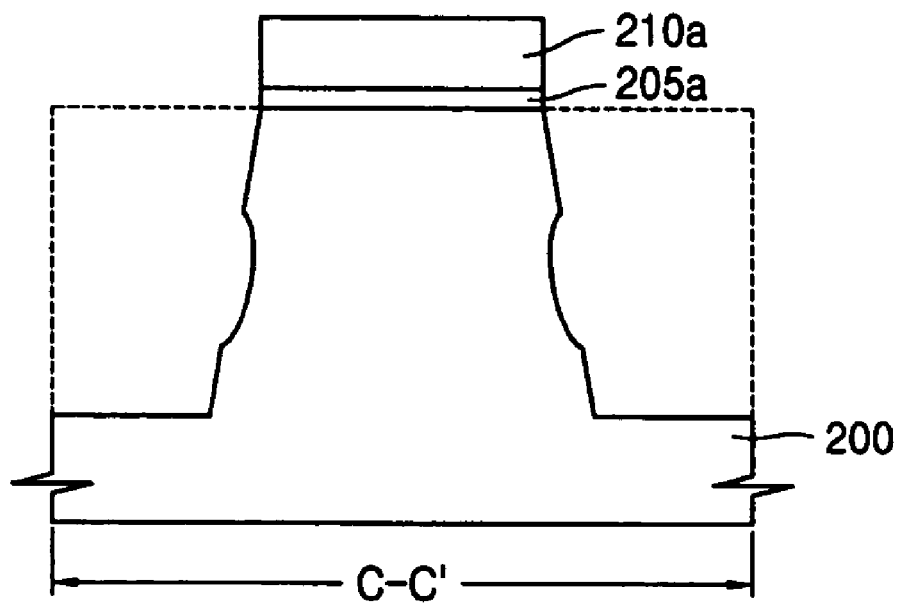

Referring to FIG. 8, using the pad oxide layer pattern 205*a* and the nitride layer pattern 210*a* as etch masks, anisotropic dry etching is performed to complete the STI trench. The anisotropic dry etching may be performed under the same condition with the initially performed anisotropic dry etching (refer to FIG. 6). In more detail, using a mixture of HBr with an amount of about 95 sccm and $O_2$ with about 5 sccm, RIE is performed with an RF electric power of about 150 to 300 Watt under a pressure of about 25 mTorr to carry out anisotropic dry etching.

Since the STI trench formed as above has a positive slope generally, filling of an insulating layer to be performed later (refer to FIG. 9) can be favorably performed. Also, the STI trench formed via foregoing multi step etching has the laterally curved rounding portion around the bottom height of the recess channel trench to be formed later.

Figure 9:
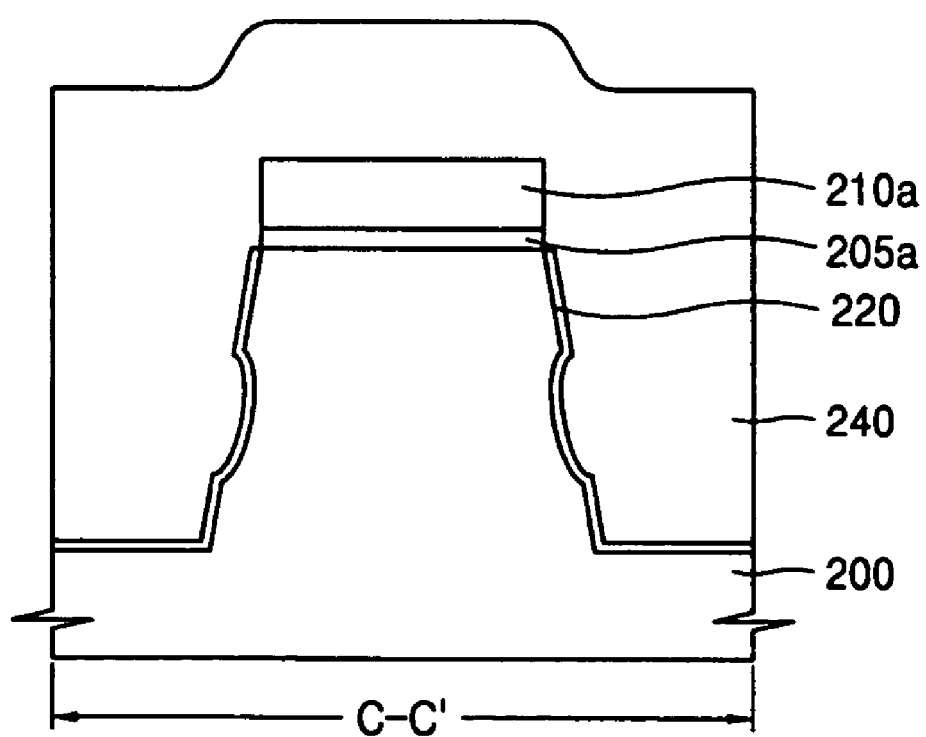

Referring to FIG. 9, after a STI liner 220 is formed along the inner wall of the STI trench, an insulating layer 240 that fills the STI trench is formed. Because the STI trench sidewall has the positive slope generally, deterioration of a gap fill margin during filling the insulating layer 240 can be minimized. The insulating layer 240 that fills the STI trench may be formed of a USG layer, a HDP oxide layer, or a TEOS layer using PECVD. Among these, the HDP oxide layer is suitable for filling the STI trench.

Figure 10:
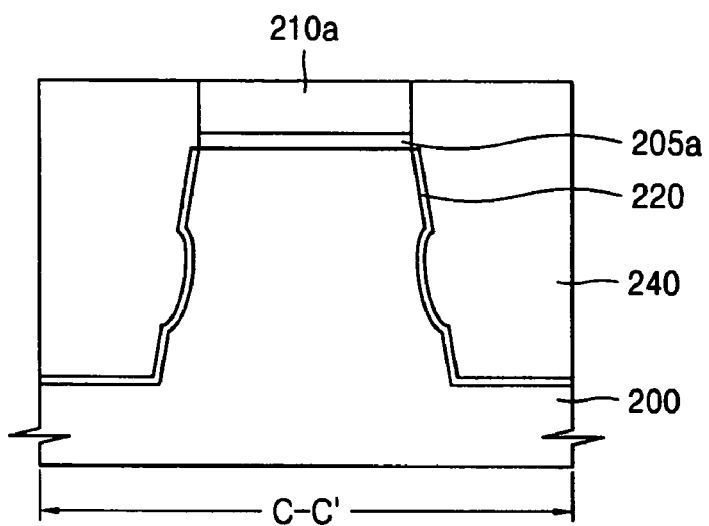

Referring to FIG. 10, the insulating layer 240 is planarized, so that the insulating layer 240 becomes substantially in the same level with an upper surface of the nitride layer pattern 210*a*. The insulating layer 240 may be planarized by CMP or etch-back. Here, the nitride layer pattern 210*a* may be used as a stop layer for a planarization process.

Figure 11:
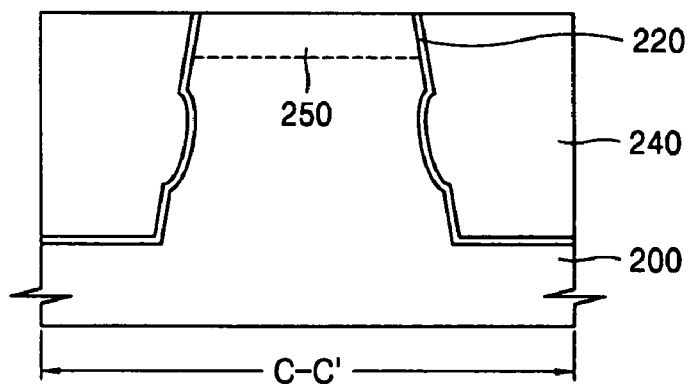

As shown in FIG. 11, the nitride layer pattern 210*a* and the pad oxide layer pattern 205*a* are removed, and then the insulating layer 240 is planarized again. Thus, a STI structure is formed while involving no steps with the semiconductor substrate 200 of the active region. The STI structure defines the active region on which a recess channel transistor will be formed later. The nitride layer pattern 210*a*, the pad oxide layer pattern 205*a* and the insulating layer 240 are planarized altogether via CMP, so that the planarization process described with reference to FIGS. 10 and 11 may be performed at once. Thereafter, an impurity with a conductivity type different from that of the semiconductor substrate 200 is implanted into the semiconductor substrate 200, thereby forming impurity regions 250 which are source and drain regions.

According to the method of forming the STI structure described above, the sidewall of the STI trench has the positive slope. This minimizes the deterioration of a gap fill margin when filling the STI trench with an insulating layer. Furthermore, because the STI trench according to this embodiment has the laterally curved rounding portion around the bottom height of the recess channel trench that is to be formed later, no residual substrate areas are formed on both bottom corners of the recess channel trench. Consequently, a sufficient channel length can be secured, thus preventing characteristics of the transistor from being degraded.

FIGS. 12*a* through 15*b* are cross-sectional views showing a process of fabricating a recess channel transistor on the semiconductor substrate formed with the STI structure according to one embodiment of the present invention. Lines A–A', B–B' and C–C' indicated along the bottom portions of respective drawings denote sectional views taken along lines A–A', B–B' and C–C' of FIG. 1*a*, respectively.

Figure 12A:
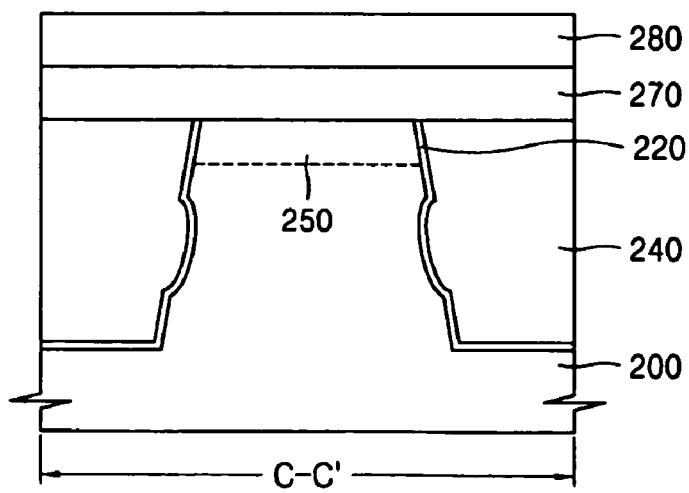
FIGS. 12a through 15b are cross-sectional views showing a process of fabricating the recess channel transistor on the semiconductor substrate formed with the STI structure thereon according to one embodiment of the present invention.
Figure 12B:
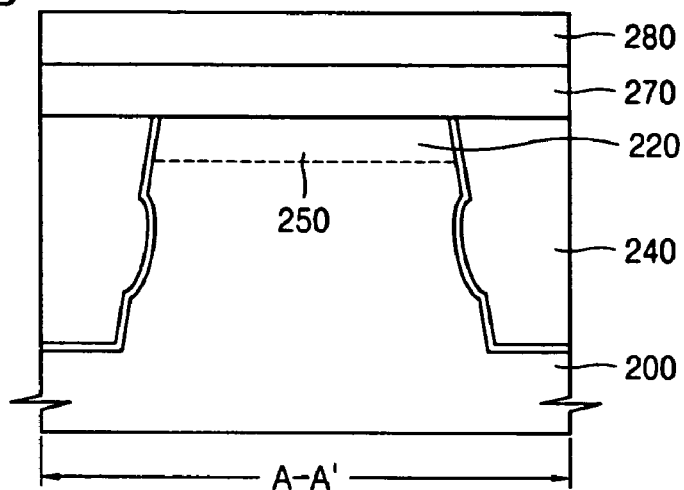

Referring to FIGS. 12*a* and 12*b*, an oxide layer 270 and a photoresist layer 280 are formed on the whole surface of the semiconductor substrate 200 including the STI structure formed according to an embodiment of the present invention. The oxide layer 270 is patterned later, and is then used as an etch mask layer for forming the recess channel trench.

Figure 13A:
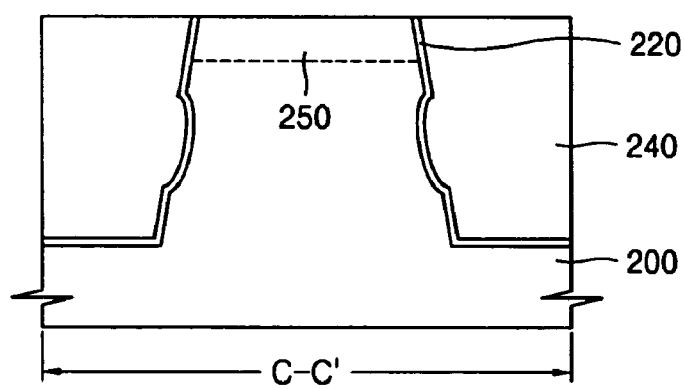
Figure 13B:
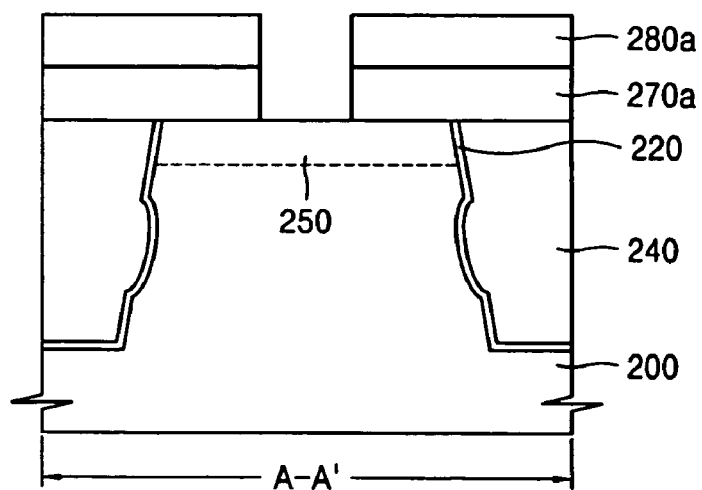

Referring to FIGS. 13*a* and 13*b*, the photoresist layer 280 is patterned, thereby forming a photoresist layer pattern 280*a* that opens a portion formed with the recess channel trench. Using the photoresist layer pattern 280*a* as an etch mask, the oxide layer 270 is selectively etched to form an oxide layer pattern 270*a*.

Figure 14A:
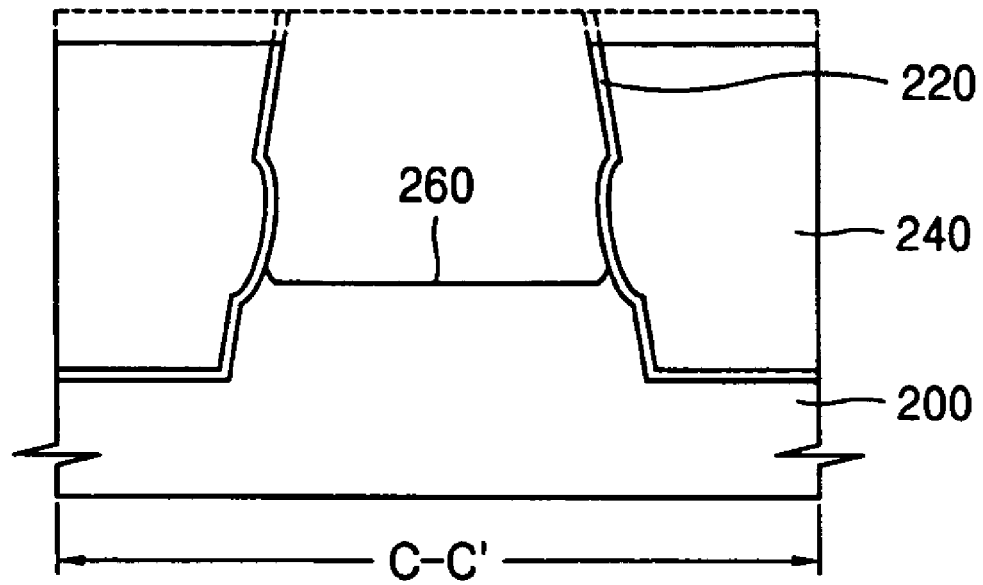
Figure 14B:
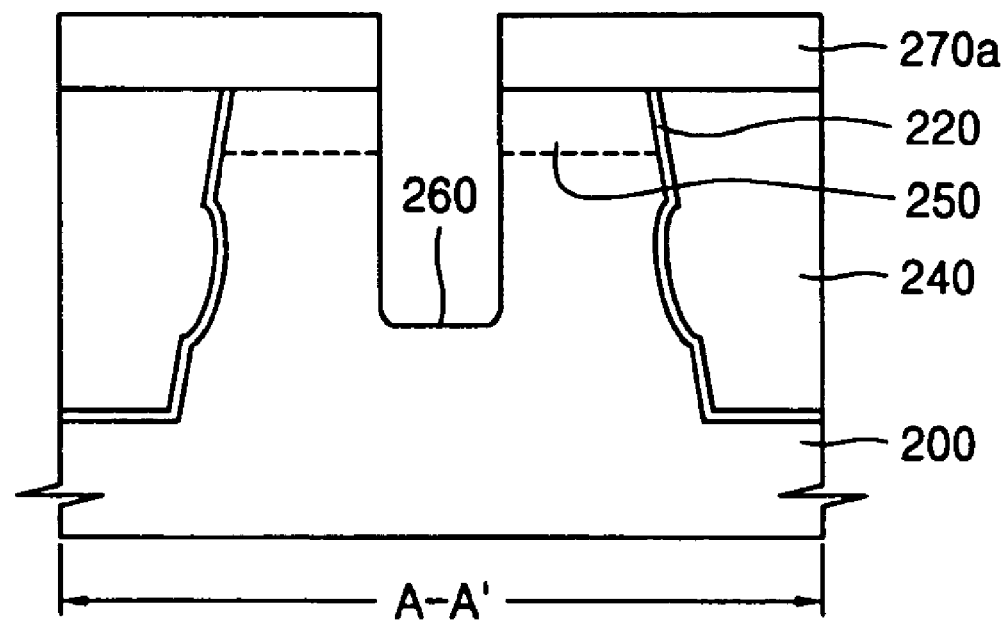

Referring to FIGS. 14*a* and 14*b*, after removing the photoresist layer pattern 280*a*, the exposed semiconductor substrate is selectively and anisotropically dry etched using the oxide layer pattern 270*a* as an etch mask, thereby forming a recess channel trench 260. At this time, as indicated by a dotted line of FIG. 14*a*, not only the semiconductor substrate 200 material but also the isolations 220 and 240 portions are slightly etched. In other words, an etch selectivity of the semiconductor substrate 200 material to the isolations 220 and 240 material is greatly large, so that the semiconductor substrate 200 is deeply etched while the isolation portion is slightly etched with a shallow depth.

As shown in FIG. 14*a*, when the recess channel trench 260 is formed in the active region defined by the STI structures 220 and 240, the sidewalls of the STI structures 220 and 240 have the laterally curved rounding portion around the bottom height of the recess channel trench 260. Therefore, the bottom surface of the recess channel trench 260 is substantially flat. That is, no residual substrate area (refer to the reference numeral 11 of FIG. 2*b*) exists. Thus, when the recess channel transistor is fabricated later, the decreased channel length of the transistor caused by the residual substrate areas does not occur.

Figure 15A:
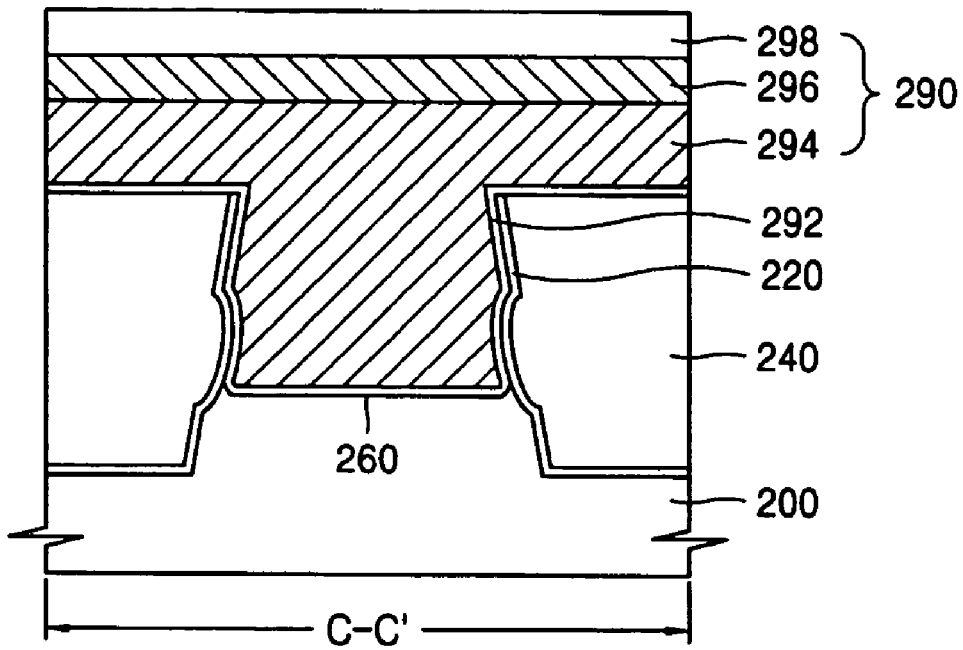
Figure 15B:
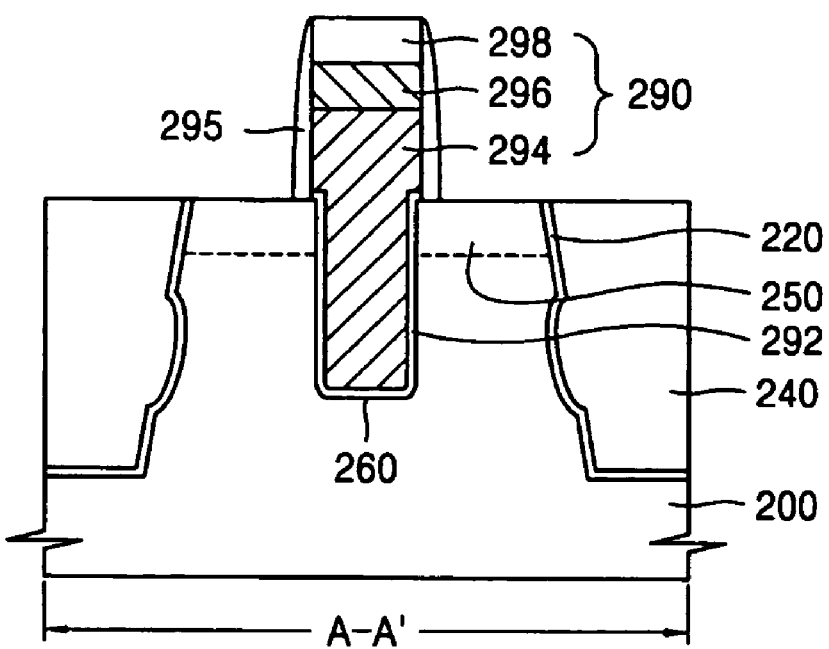

Referring to FIGS. 15*a* and 15*b*, after a gate dielectric layer 292 is formed along the inner wall of the recess channel trench 260, patterns of a gate polysilicon layer 294 of filling the recess channel trench 260, a gate metal layer 296 such as WSi and a capping layer 298 such as a nitride layer may be formed on the gate oxide layer 292. By doing so, a recess gate formed of the gate oxide layer 292 and a gate stack 290 is formed. Thereafter, sidewall spacers 295 may be formed along sidewalls of the gate polysilicon layer 294, the gate metal layer 296 and the capping layer 298, which form the gate stack 290. Therefore, the recess channel transistor is fabricated including the recess gate 290 and 292 and the source and drain regions 250 formed in both sides of the recess gate.

As shown in FIG. 15a, when the recess channel transistor is fabricated in the active region defined by the STI structure according to the present invention, the bottom surface of the recess gate becomes substantially flat. Consequently, the channel length at the center of the active region almost equals to the channel length at the periphery of the active region. Thus, the decrease of the channel length at the periphery of the active region can be inhibited.

If the recess channel trench is formed in the active region defined by the STI structure according to an aspect of the present invention as described above, the rounding portion of the STI structure inhibits formation of residual substrate areas on both bottom corners of the recess channel trench. Due to this fact, the bottom surface of the recess channel trench becomes substantially flat, thereby preventing the decrease of the channel length on the periphery of the active region. As a result, decrease of a threshold voltage and increase of a leakage current caused by the decreased channel length can be inhibited, and device characteristics of the recess channel transistor can be improved. Additionally, according to the present invention, the sidewall of the STI trench has a generally positive slope except for the rounding portion, thereby minimizing deterioration of a gap fill margin during filling the insulating layer.

It is noted that the STI liner further has an oxide layer formed on the nitride layer in addition to the oxide layer and the nitride layer formed thereon. The oxide layer on the nitride layer may be a High Temperature Oxide (HTO) layer.

It is also noted that the sidewall of the STI trench may have a positive slope of about 75° to 85° except for the rounding portion.

The method described above for forming a STI structure includes (a) forming a mask layer pattern that defines the active region on a semiconductor substrate. Then, in a step (b), the semiconductor substrate is anisotropically dry etched to form a trench in the semiconductor substrate using the mask layer pattern as an etch mask. After forming a laterally curved rounding portion by isotropically etching the semiconductor substrate around a bottom height of the recess channel trench using the mask layer pattern as an etch mask in a step (c), the semiconductor substrate is anisotropically dry etched to form a STI trench using the mask layer pattern as an etch mask in a step (d). Thereafter, the method includes (e) forming an insulating layer that fills the STI trench on the resultant structure formed with the STI trench therein. Then, in a step (f), the resultant structure formed with the insulating layer thereon is planarized until a surface of the semiconductor substrate is exposed, and forming a STI structure that defines the active region.

It is noted that the anisotropic dry etching in the steps (b) and (d) may be reactive ion etching using a mixture including HBr and $O_2$. In this case, the reactive ion etching in the steps (b) and (d) is performed by supplying HBr and $O_2$ gases with an amount of about 95 sccm and 5 sccm, respectively, under a pressure of about 25 mTorr. During the reactive ion etching in the steps (b) and (d), it is preferable to maintain an RF electric power by 150 to about 300 Watt. It is noted that step (c) may be wet etching, or isotropic dry etching.

It is also noted that when the isotropic etching in the step (c) is the isotropic dry etching, it may be reactive ion etching using a mixture including $SF_6$, HBr and $O_2$. Here, $SF_6$, HBr and $O_2$ gases are supplied with an amount of 45 sccm, 75 sccm and 8 sccm, respectively, under a pressure of about 7 mTorr. Preferably, the reactive ion etching in the step (c) is performed with an RF electric power of about 100 to 500 Watt. At this time, the mixture used during reactive ion etching in the step (c) further comprises $NF_3$.

The method of forming the STI structure further includes forming a STI liner along an inner wall of the STI trench between the steps (d) and (e). Here, the forming the STI liner along the inner wall of the STI trench includes forming an oxide layer along the inner wall of the STI trench in accordance with the shape of the inner wall of the STI trench. A nitride layer is formed on the oxide layer in accordance with the shape of the inner wall of the STI trench. Then, an oxide layer is formed on the nitride layer in accordance with the shape of the inner wall of the STI trench.

When the recess channel trench is formed in the active region after the step (f), a bottom surface of the recess channel trench is substantially flat. Accordingly, a channel length at a periphery of the active region equals to a channel length at a center portion of the active region.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of forming a semiconductor device including a STI structure for defining an active region on a semiconductor substrate, the active region being structured to have a recess channel trench therein, the method comprising:
   (a) forming a mask layer pattern that defines the active region on the semiconductor substrate;
   (b) anisotropically etching the semiconductor substrate to form a top portion of a STI trench in the semiconductor substrate, using the mask layer pattern as an etch mask;
   (c) forming a laterally curved middle portion of the STI trench by isotropically etching the semiconductor substrate at about the bottom height of the recess channel trench, using the mask layer pattern as an etch mask;
   (d) anisotropically etching the semiconductor substrate to form a bottom portion of the STI trench, using the mask layer pattern as an etch mask; and
   (e) forming an insulating layer that fills the STI trench.

2. The method of claim 1, wherein anisotropic etching in the step (b) is performed while a passivation layer is formed by oxidation.

3. The method of claim 1, wherein anisotropic etching in the steps (b) and (d) is reactive ion etching using a mixture including HBr and $O_2$.

4. The method of claim 3, wherein reactive ion etching in the steps (b) and (d) is performed by supplying HBr and $O_2$ gases with an amount of about 95 sccm and 5 sccm, respectively, under a pressure of about 25 m Torr.

5. The method of claim 4, wherein reactive ion etching in the steps (b) and (d) is performed with an RF electric power of about 150 to 300 Watt.

6. The method of claim 1, wherein isotropic etching in the step (c) is wet etching.

7. The method of claim 1, wherein isotropic etching in the step (c) is isotropic dry etching.

8. The method of claim 7, wherein isotropic dry etching in the step (c) is reactive ion etching using a mixture including $SF_6$, HBr and $O_2$.

9. The method of claim 8, wherein the reactive ion etching in the step (c) is performed by supplying $SF_6$, HBr and $O_2$ gases with an amount of about 45 sccm, 75 sccm and 8 sccm, respectively, under a pressure of about 7 m Torr.

10. The method of claim 9, wherein reactive ion etching in the step (c) is performed with an RF electric power of 100 to 500 Watt.

11. The method of claim 8, wherein the mixture used during reactive ion etching in the step (c) further comprises $NF_3$.

12. The method of claim 1, further comprising forming a STI liner along an inner wall of the STI trench between the steps (d) and (e).

13. The method of claim 12, wherein the forming the STI liner along the inner wall of the STI trench comprises:
   forming an oxide layer along the inner wall of the STI trench in accordance with a shape of the inner wall of the STI trench;
   forming a nitride layer on the oxide layer in accordance with a shape of the inner wall of the STI trench; and
   forming an oxide layer on the nitride layer in accordance with a shape of the inner wall of the STI trench.

14. The method of claim 1, wherein, when a recess channel trench is formed in the active region, a bottom surface of the recess channel trench is substantially flat.

15. The method of claim 14, wherein a channel length at a periphery of the active region is substantially equal to a channel length at a center portion of the active region.

16. The method of claim 1, further comprising:
   planarizing the insulating layer to form the STI structure; and
   forming a recess channel transistor on the semiconductor formed with the STI structure.

17. The method of claim 16, further comprising removing the mask layer pattern before planarizing the insulating layer.

* * * * *